(12) United States Patent
Searls et al.

(10) Patent No.: US 6,550,531 B1
(45) Date of Patent: Apr. 22, 2003

(54) VAPOR CHAMBER ACTIVE HEAT SINK

(75) Inventors: Damion T. Searls, Portland, OR (US); Terrance J. Dishongh, Hillsboro, OR (US); Prateek J. Dujari, Portland, OR (US); Bin Lian, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/572,926

(22) Filed: May 16, 2000

(51) Int. Cl.[7] ............................................. F28D 15/00
(52) U.S. Cl. ........................... 165/104.33; 165/104.26; 361/700; 257/716
(58) Field of Search ................ 165/80.3, 80.4, 165/104.26, 104.33; 361/699, 700; 257/716; 174/15.2

(56) References Cited

U.S. PATENT DOCUMENTS

| | | | | |
|---|---|---|---|---|
| 4,796,155 A | * | 1/1989 | Saito et al. ............ 165/104.33 |
| 4,823,869 A | * | 4/1989 | Arnold et al. ............... 165/185 |
| 4,918,571 A | * | 4/1990 | Grabble ..................... 174/16.3 |
| 5,305,184 A | * | 4/1994 | Andresen et al. ............ 361/699 |
| 5,323,292 A | * | 6/1994 | Brzezinski ............. 165/104.33 |
| 5,390,077 A | * | 2/1995 | Paterson ...................... 361/700 |
| 5,508,884 A | * | 4/1996 | Brunet et al. ............... 165/80.4 |
| 5,529,115 A | * | 6/1996 | Paterson ................. 165/104.33 |
| 5,694,295 A | * | 12/1997 | Mochizuki et al. ......... 361/699 |
| 5,844,313 A | * | 12/1998 | Hoffmann .................... 257/722 |
| 5,986,884 A | * | 11/1999 | Jairazbhoy et al. ......... 361/700 |
| 6,082,443 A | * | 7/2000 | Yamamoto et al. .... 165/104.26 |
| 6,085,831 A | * | 7/2000 | DiGiacomo et al. ... 165/104.33 |

* cited by examiner

Primary Examiner—Henry Bennett
Assistant Examiner—Terrell McKinnon
(74) Attorney, Agent, or Firm—Robert G. Winkle

(57) ABSTRACT

A heat dissipation device including a base portion having a plurality of projections extending therefrom. The base portion may have a vapor chamber defined therein and may have first surface sloped from a central apex portion to edges of the base portion. The vapor chamber includes at least one extension on a vapor chamber upper surface which is adapted to direct a condensed working fluid toward a desired location on a vapor chamber lower surface. The vapor chamber lower surface may have at least one depression to collect a greater portion of the working fluid in a desired location(s).

4 Claims, 6 Drawing Sheets

VAPOR CHAMBER ACTIVE HEAT SINK

BACKGROUND OF THE INVENTION

1. Field of the Invention

The present invention relates to apparatus and methods for removal of heat from electronic devices. In particular, the present invention relates to a vapor chamber in conjunction with a heat sink for the removal of heat from a microelectronic die.

2. State of the Art

Higher performance, lower cost, increased miniaturization of integrated circuit components, and greater packaging density of integrated circuits are ongoing goals of the computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of a high surface area heat sink to a microelectronic die. FIG. 5 illustrates an assembly 200 comprising a microelectronic die 202 (illustrated as a flip chip) physically and electrically attached to a substrate carrier 204 by a plurality of solder balls 206. A heat sink 208 is attached to a back surface 212 of the microelectronic die 202 by a thermally conductive adhesive 214. The heat sink 208 is usually constructed from a thermally conductive material, such as copper, copper alloys, aluminum, aluminum alloys, and the like. The heat generated by the microelectronic die 202 is drawn into the heat sink 208 (following the path of least thermal resistance) by conductive heat transfer.

High surface area heat sinks 208 are generally used because the rate at which heat is dissipated from a heat sink is substantially proportional to the surface area of the heat sink. The high surface area heat sink 208 usually includes a plurality of projections 216 extending substantially perpendicularly from the microelectronic die 202. It is, of course, understood that the projections 216 may include, but are not limited to, elongate planar fin-like structures and columnar/pillar structures. The high surface area of the projections 216 allows heat to be convectively dissipated from the projections 216 into the air surrounding the high surface area heat sink 208. A fan 218 may be incorporated into the assembly 200 to enhance the convective heat dissipation. However, although high surface area heat sinks are utilized in a variety of microelectronic applications, they have not been completely successful in removing heat from microelectronic dice which generate substantial amounts of heat. One issue which may contribute to this lack of success is the fact that the geometry of standard high surface area heat sinks results in an air stagnation zone over the center of the heat sink (generally where the most heat is being generated within the microelectronic die). This air stagnation may occur even with the use of the fan 218.

Another known method of removing heat from a microelectronic die is the use of a "heat pipe" or "vapor chamber" 240, as shown in FIG. 6. A vapor chamber 240 is a simple device that can quickly transfer heat from one point to another without the need for external energy input. The vapor chamber 240 is generally formed by creating a low-pressure atmosphere within a sealed chamber 242 which contains a "working fluid" 244, such as water or alcohol. The sealed chamber 242 is oriented with a first end 246 proximate a heat source 248. The working fluid 244, which is in a liquid phase proximate the heat source 248, increases in temperature and evaporates to form a gaseous phase of the working fluid 244, which moves (shown by arrows 252) toward a second end 254 of the sealed chamber 242. As the gaseous phase moves toward the sealed chamber second end 254, it condenses to again form the liquid phase of the working fluid 244, thereby releasing the heat absorbed during the evaporation of the liquid phase of the working fluid 244. The liquid phase returns to the sealed chamber first end 246 proximate the heat source 248, wherein the process is repeated. Thus, the vapor chamber 240 is able to rapidly transfer heat away from the heat source 248. Various configurations of heat pipes and high surface area finned heat sink have been used to cool microelectronic dice, but they have not been entirely successful in efficiently removing heat from microelectronic dice which generate substantial amounts of heat. One issue which may contribute to this lack of success is the fact that "hotspots" occur in specific locations within the microelectronic dice. The current configurations do not compensate with a higher heat removal for these hotspots. Thus, the circuitry at or proximate these hotspots can be thermally damaged.

Therefore, it would be advantageous to develop apparatus and techniques to effectively remove heat from microelectronic dice while compensating for thermal variations, such as hot spots, within the microelectronic dice.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Although the figures illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

Figure 1:
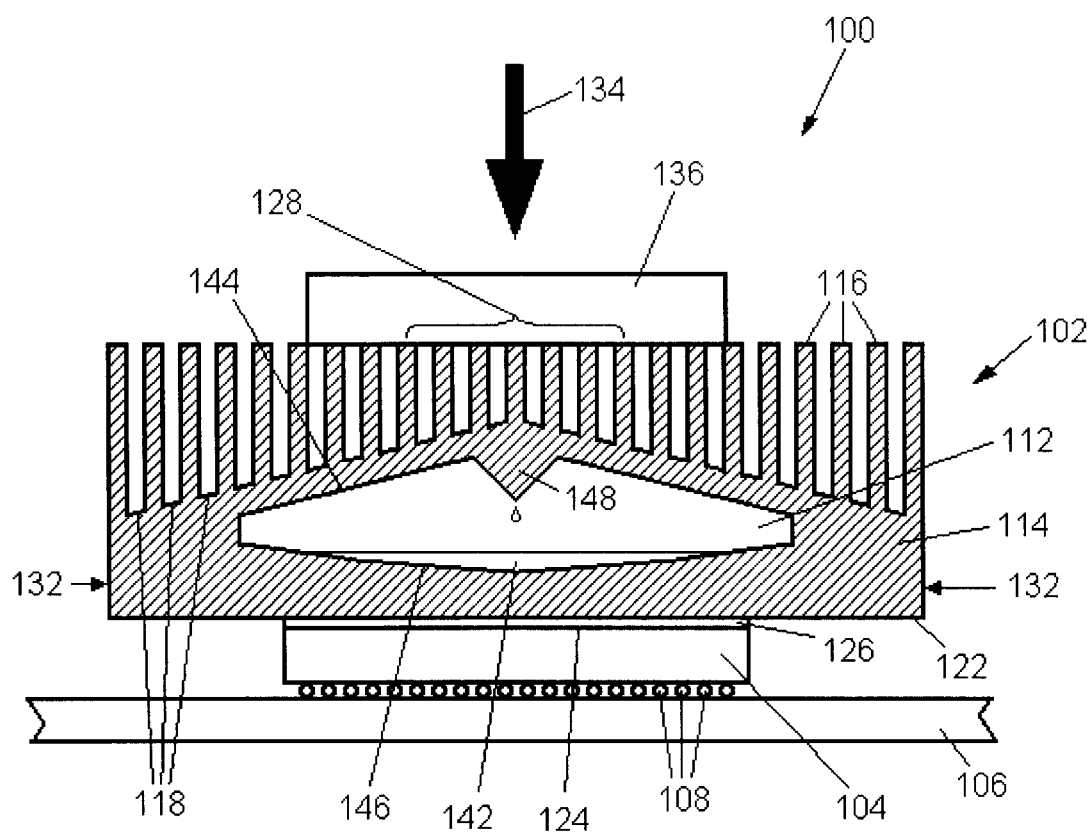
FIG. 1 is a side cross-sectional view of a first embodiment of a heat dissipation device attached to a microelectronic die, according to the present invention.

FIG. 1 illustrates a microelectronic assembly 100 of the present invention comprising a heat dissipation device 102 attached to a microelectronic die 104 (illustrated as a flip chip). The microelectronic die 104 is physically and electrically attached to a substrate 106 by a plurality of solder balls 108. The heat dissipation device 102 comprises a base portion 114 with a vapor chamber 112 incorporated therein and a plurality of projections 116 extending from a first surface(s) 118 of the base portion 114. The projections 116 are generally molded during the formation of the heat dissipation device 102 or machined therein after formation. It is, of course, understood that the projections 116 may include, but are not limited to, elongate planar fin-like structures (extending perpendicular to the figure) and columnar/pillar structures.

Preferably, the projections 116 extend substantially perpendicularly to a mounting surface 122 of the base portion 114. The base portion mounting surface 122 is a mounting surface opposing said base portion first surface 11 8 for the attachment of the heat dissipation device 102 to a heat source. As shown in FIG. 1, the base portion mounting surface 122 is attached to a back surface 124 of the microelectronic die 102, preferably by a thermally conductive adhesive 126. Although the heat dissipation device 102 is illustrated as being attached to the microelectronic die 104, the invention is, of course, not so limited. The heat dissipation device 102 may be attached to any surface from which heat is desired to be dissipated.

Figure 2:
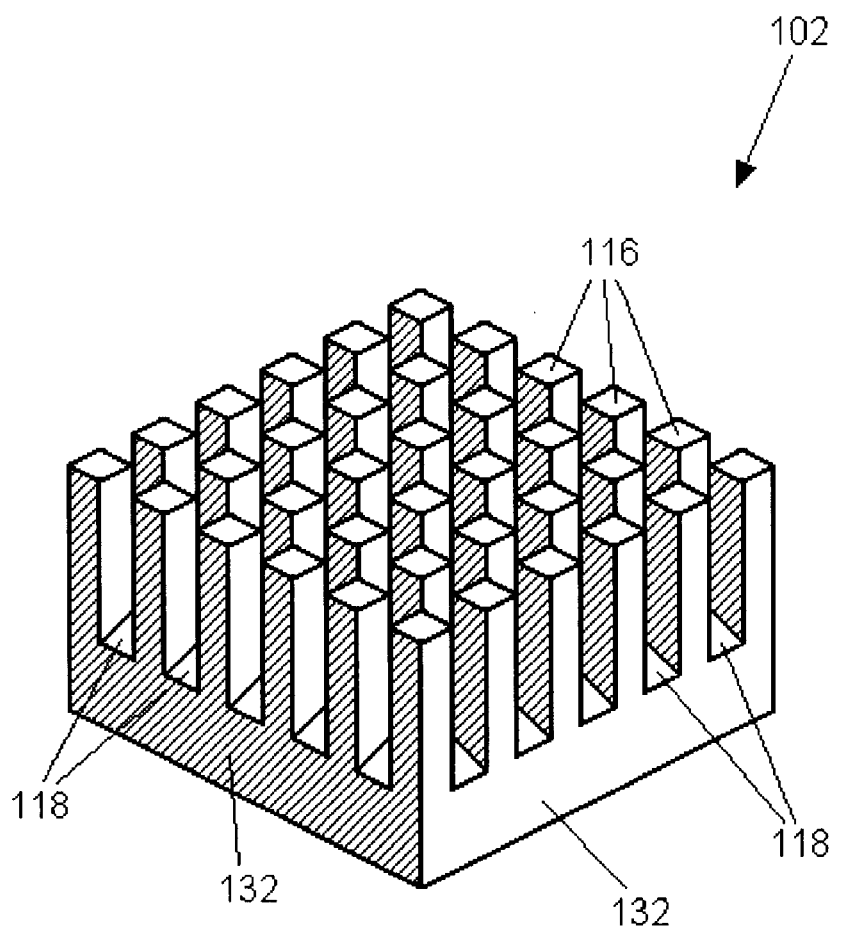
FIG. 2 is an oblique view of a heat dissipation device, according to the present invention.

The base portion first surface 118, from which the projections 116 extend, is preferably sloped from a central apex portion 128 of the heat dissipation device 102 to the edges 132 thereof. Thus, the base portion first surface 118 forms a slightly coned or pyramidal shaped surface. This topography may also be seen in FIG. 2 wherein the projections 116 are shown as pillars. Air is blown in direction 134 into space between the projections 116 by a fan 136 residing over the projections 116 (see FIG. 1). The sloped base portion first surface 118 results in an increasing volume of space between the projections 116 from the heat dissipation device central apex portion 128 to the heat dissipation device edges 132. This allows air to flow between the projections 116 more effectively which may reduce or eliminate air stagnation. Thus, the improved airflow improves convective heat dissipation from of the heat dissipation device 102.

FIG. 1 illustrates the vapor chamber 112 as a hollow, sealed structure defining a chamber which contains a working fluid 142, such as water or alcohol. The vapor chamber 112 is preferably under a low-pressure atmosphere or partial vacuum. The heat dissipation device 102 is preferably constructed from a thermally conductive material, such as copper, copper alloys, aluminum, aluminum alloys, and the like.

As previously discussed, the working fluid 142 is generally in a liquid phase proximate the heat source, i.e., the microelectronic die 104. As the microelectronic die 104 heats under normal operation, the temperature of the working fluid 142 within the vapor chamber 112 is increased, resulting in the evaporation of the working fluid 142 to form a gaseous phase. As the gaseous phase moves toward an upper surface(s) 144 of the vapor chamber 112, it condenses to again form the liquid phase of the working fluid 142, thereby releasing the heat absorbed during the evaporation of the liquid phase of the working fluid 142. The liquid phase returns, by gravity, to a lower surface 146 of the vapor chamber 112 proximate the microelectronic die 104, wherein the process is repeated. Thus, the vapor chamber 112 is able to rapidly transfer heat away from the microelectronic die 104 to the projections 116 for dissipation of the heat to the surrounding air.

The vapor chamber 112 further includes at least one extension 148, such as a cone, prism, pyramid, and the like, which assists in directing condensed working fluid 142 toward at least one specific location on the vapor chamber lower surface 146. Furthermore, the vapor chamber lower surface 146 can be contoured to collect a greater amount of the liquid phase of the working fluid 142 over a particular location above the microelectronic die 104. Thus, the vapor chamber 112 can be design to have a higher heat remove efficiency over a "hot spot" (i.e., a specific high heat generation location on a microelectronic die) on the microelectronic die 102. FIG. 1 illustrates the vapor chamber lower surface 146 curved to collect the liquid phase of the working fluid 142 over a central portion of the microelectronic die 104 and the extension 148 positioned to assist condensed working fluid 142 to drop into the area over the microelectronic die central portion.

Figure 3:
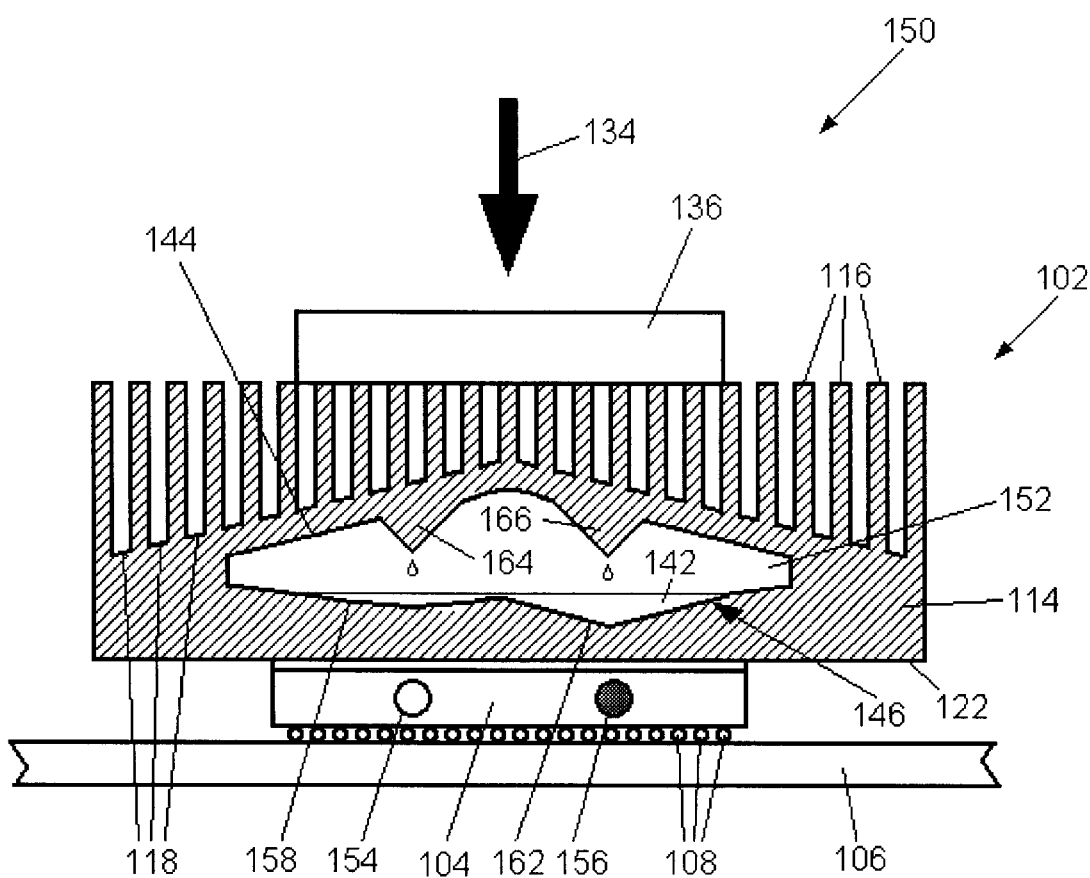
FIG. 3 is a side cross-sectional view of an alternate embodiment of a heat dissipation device attached to a microelectronic die, according to the present invention.

The present invention is, or course, not limited to any specifically illustrated configuration. The heat dissipation device of the present invention may have a variety of configurations. For example, FIG. 3 illustrates another embodiment of a microelectronic assembly 150 of the present invention that is similar to the embodiment illustrated in FIG. 1. The embodiments differ in the design of their vapor chambers. FIG. 3 illustrates a vapor chamber 152 that is designed to dissipate heat from two hot spots within the microelectronic die 104. The first hot spot 154 is illustrated simply as an unfilled dot and the second hot spot 156 is illustrated as a filled dot. For illustration purposes, the second hot spot 156 is defined to generate more heat than the first hot spot 154.

As illustrated in FIG. 3, the vapor chamber lower surface 146 includes a shallow depression 158 and a deep depression 162. The shallow depression 158 collects a portion of the working fluid 142 over the first hot spot 154 and the deep depression 162 collects a greater portion of the working fluid 142 over the second hot spot 156. The vapor chamber 152 further includes a first extension 164 over the shallow depression 158 and a second extension 166 over the deep depression 162.

The greater portion of the working fluid 142 over the second hot spot 156 allows higher heat dissipation to accommodate for the greater heat being generated from the second hot spot 156. Thus, the vapor chamber 152 can be modified in any fashion to accommodate numerous thermal variations within the microelectronic die 104.

Figure 4:
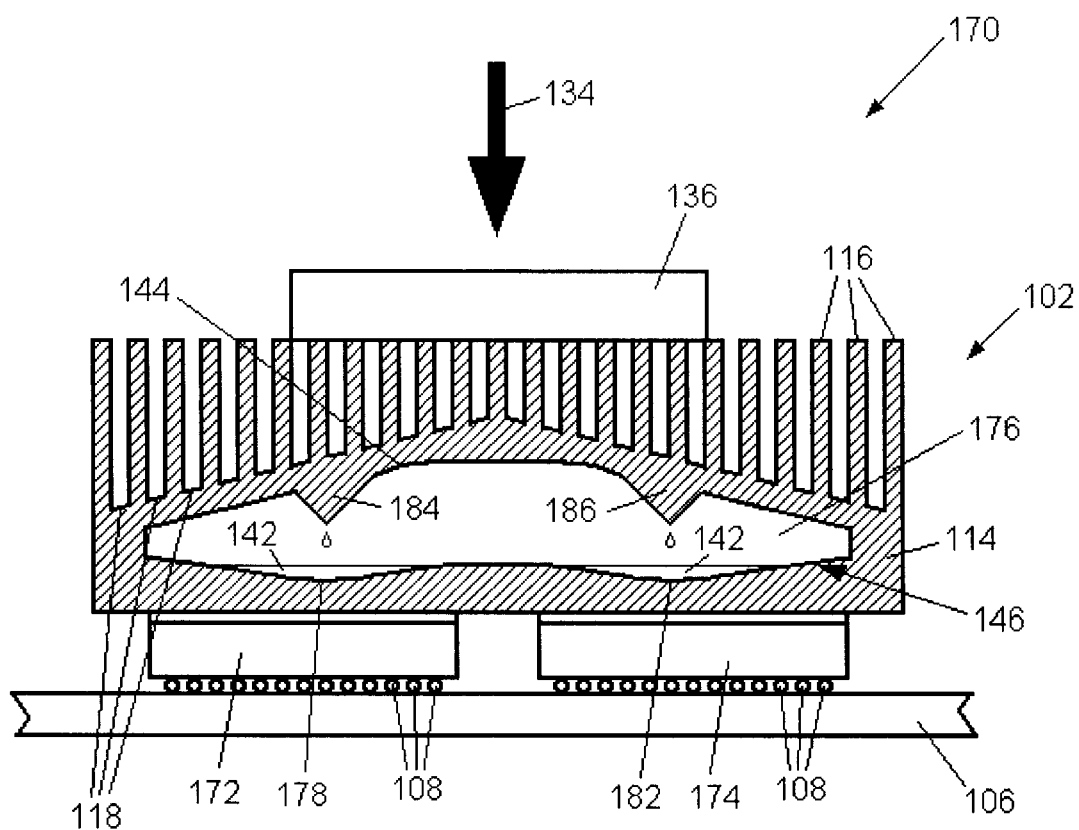
FIG. 4 is a side cross-sectional view of an embodiment of a heat dissipation device attached to multiple microelectronic dice, according to the present invention.
Figure 5:
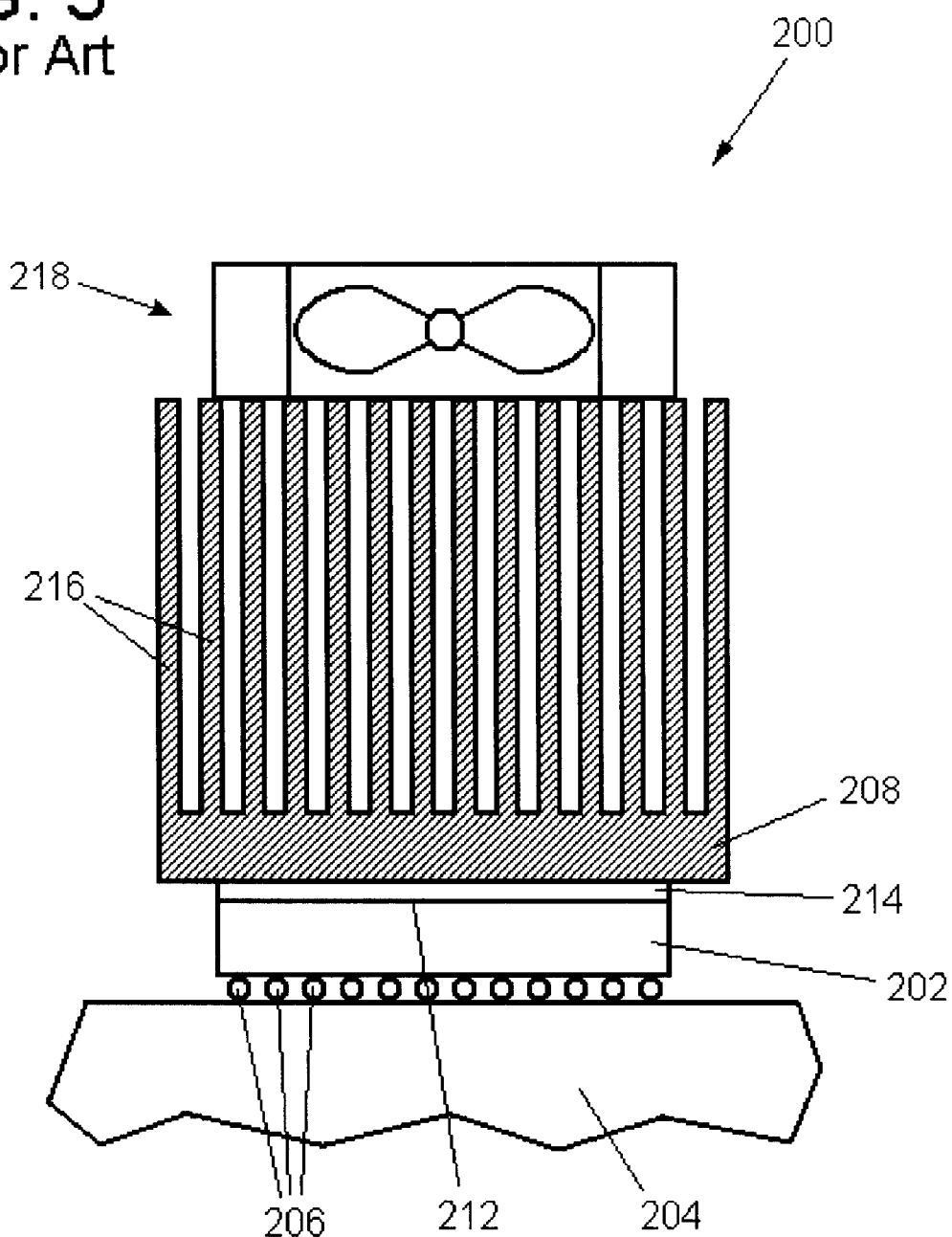
FIG. 5 is a side cross-sectional view of a wheat dissipation device attached to a microelectronic die, as known in the art.
Figure 6:
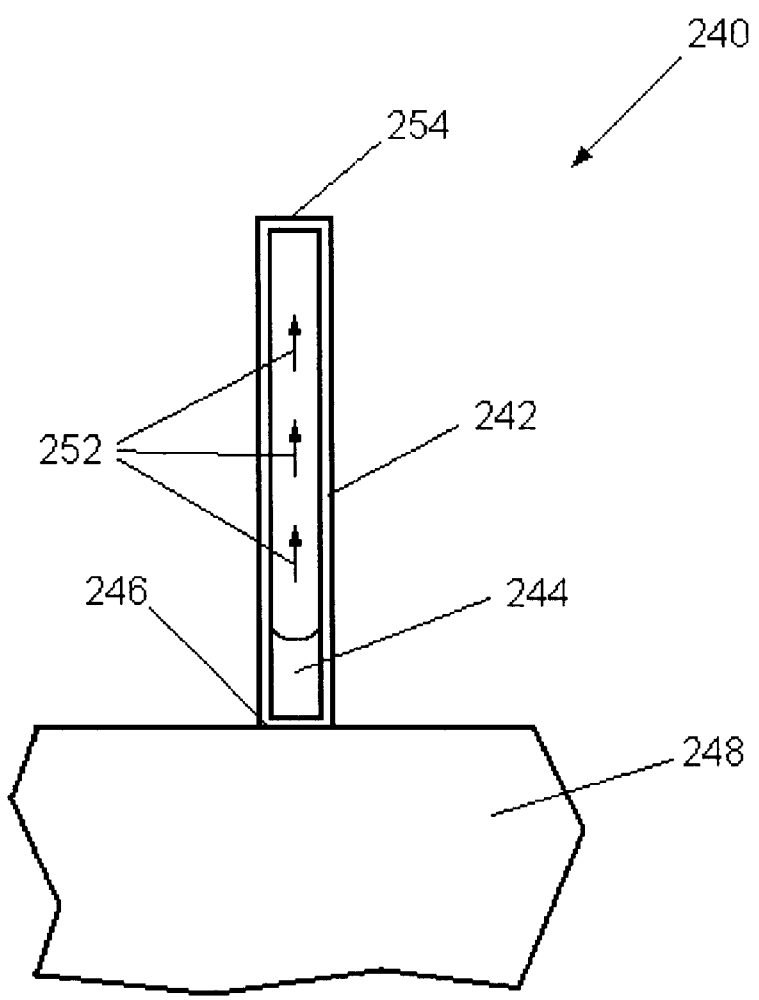
FIG. 6 is a side cross-sectional view of a vapor chamber, as known in the art.

Furthermore, the present invention is not limited to a single heat dissipation device attached to a single microelectronic die. The present invention encompasses multiple heat dissipation devices on a single microelectronic device, as well as, a single heat dissipation device being used to remove heat from multiple microelectronic dice. For example, FIG. 4 illustrates a single heat dissipation device 170 attached to multiple microelectronic dice (illustrated as first microelectronic die 172 and second microelectronic die 174). A vapor chamber 176 within the base portion 114 of the heat dissipation device 102 includes a first depression 178 in the vapor chamber lower surface 146 over the first microelectronic die 172. The vapor chamber 176 further includes a second depression 182 in the vapor chamber lower surface 146 over the second microelectronic die 174. A first extension 184 and a second extension 186 are aligned over the first depression 178 and the second depression 182, respectively.

It is, of course, understood that the present invention is not limited to using the sloped base portion first surface in conjunction with the specific vapor chamber designs described herein. The sloped base portion first surface can used in a heat dissipation device which does not include a vapor chamber or includes a vapor chamber having a design known in the art. Further, the vapor chamber designs need not be included with a heat dissipation device which has a sloped base portion first surface, but may be included in any heat dissipation device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A heat dissipation device, comprising:

a base portion having a first surface sloped from a central apex portion thereof to edges of said base portion such that a substantially pyramidal shape is formed;

said a plurality of projections extending from said base portion first surface; and a chamber defined within said base portion, wherein said chamber includes a working fluid disposed therein.

2. The heat dissipation device of claim 1, wherein said base portion further includes a mounting surface, wherein said plurality of projections extend from said base portion first surface substantially perpendicularly to said base portion mounting surface.

3. The heat dissipation device of claim 1, further including at least one extension on an upper surface of said chamber, wherein said at least one extension is positioned to direct working fluid toward a desired location on a lower surface of said chamber.

4. The heat dissipation device of claim 1, further including at least one depression in a lower surface of said chamber.

* * * * *

UNITED STATES PATENT AND TRADEMARK OFFICE
CERTIFICATE OF CORRECTION

PATENT NO. : 6,550,531 B1
DATED : April 22, 2003
INVENTOR(S) : Searls et al.

It is certified that error appears in the above-identified patent and that said Letters Patent is hereby corrected as shown below:

Column 2,
Line 51, delete "wheat", insert -- heat --.

Signed and Sealed this

Sixteenth Day of September, 2003

JAMES E. ROGAN
*Director of the United States Patent and Trademark Office*